(12) United States Patent
Lamberson et al.

(10) Patent No.: US 7,641,976 B2
(45) Date of Patent: Jan. 5, 2010

(54) GLASS PACKAGE THAT IS HERMETICALLY SEALED WITH A FRIT AND METHOD OF FABRICATION

(75) Inventors: Lisa Ann Lamberson, Painted Post, NY (US); Robert Michael Morena, Lindley, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 12/087,094

(22) PCT Filed: Nov. 28, 2006

(86) PCT No.: PCT/US2006/045744

§ 371 (c)(1),
(2), (4) Date: Jun. 24, 2008

(87) PCT Pub. No.: WO2007/067402

PCT Pub. Date: Jun. 14, 2007

(65) Prior Publication Data

US 2009/0069164 A1    Mar. 12, 2009

Related U.S. Application Data

(60) Provisional application No. 60/748,301, filed on Dec. 6, 2005.

(51) Int. Cl.
*H01J 1/62* (2006.01)
*H05B 33/00* (2006.01)
*H05B 33/04* (2006.01)
*H05B 33/10* (2006.01)
*C03C 8/14* (2006.01)

(52) U.S. Cl. .......... 428/428; 313/504; 313/512; 428/426; 428/427; 428/432; 445/24; 445/25; 501/17; 501/24; 501/46

(58) Field of Classification Search .......... 501/17, 501/24, 46; 313/504, 512; 445/24, 25; 428/426, 428/427, 428, 432

See application file for complete search history.

(56) References Cited

U.S. PATENT DOCUMENTS

| | | |
|---|---|---|
| 6,998,776 B2* | 2/2006 | Aitken et al. .......... 313/512 |
| 2004/0207314 A1 | 10/2004 | Aitken et al. |
| 2005/0001545 A1 | 1/2005 | Aitken et al. |
| 2006/0009109 A1 | 1/2006 | Aitken et al. |
| 2006/0082298 A1* | 4/2006 | Becken et al. .......... 313/512 |
| 2006/0084348 A1* | 4/2006 | Becken et al. .......... 445/25 |

* cited by examiner

*Primary Examiner*—Anthony J Green
(74) *Attorney, Agent, or Firm*—Christopher Niscastri; Siwen Chen

(57) ABSTRACT

A hermetically sealed glass package preform is provided comprising a glass substrate; a frit comprising 65-100 wt. % of a base glass and about 0-35 wt. % of a filler; wherein the base glass comprises: about 0-5 mole % $K_2O$; about 0-35 mole % $Sb_2O_3$; about 0-20 mole % $ZnO$; about 10-40 mole % $P_2O_5$; about 10-60 mole % $V_2O_5$; about 0-5 mole % $TiO_2$; about 0-5 mole % $B_2O_3$; about 0-5 mole % $SiO_2$; about 0-5 mole % $WO_3$; and about 1-10 mole % of a metal oxide selected from the group consisting of $Fe_2O_3$, $Nd_2O_3$, $La_2O_3$, $Ce_2O_4$, $Pr_6O_{11}$, $Er_2O_3$, and $CeO_2$; wherein the base glass has a mean particle size distribution of less than about 3 µm; and wherein the filler has a mean particle size distribution of between about 3 and 7 µm. The frit is sintered in an atmosphere less oxidizing than air at a temperature of between about 390° C. to 415° C.

20 Claims, 2 Drawing Sheets

GLASS PACKAGE THAT IS HERMETICALLY SEALED WITH A FRIT AND METHOD OF FABRICATION

CROSS REFERENCE TO RELATED APPLICATIONS

This application claims the benefit under 35 USC §119(e) of U.S. Provisional Application No. 60/748,301, filed on Dec. 6, 2005.

BACKGROUND OF THE INVENTION

1. Field of the Invention

The present invention relates to hermetically sealed glass packages that are suitable to protect thin film devices that are sensitive to the ambient environment. Some examples of such devices are organic light emitting diode (OLED) displays, sensors, and other optical devices. The present invention is demonstrated using OLED displays as an example.

2. Description of Related Art

OLEDs have been the subject of a considerable amount of research in recent years because of their use and potential use in a wide variety of electroluminescent devices. For instance, a single OLED can be used in a discrete light emitting device or an array of OLEDs can be used in lighting applications or flat-panel display applications (e.g., OLED displays). The traditional OLED displays are known as being very bright and having a good color contrast and wide viewing angle. However, the traditional OLED displays and in particular the electrodes and organic layers located therein are susceptible to degradation resulting from interaction with oxygen and moisture leaking into the OLED display from the ambient environment. It is well known that the life of the OLED display can be significantly increased if the electrodes and organic layers within the OLED display are hermetically sealed from the ambient environment. Unfortunately, in the past it was very difficult to develop a sealing process to hermetically seal the OLED display. Some of the factors that made it difficult to properly seal the OLED display are briefly mentioned below:

The hermetic seal should provide a barrier for oxygen (10-3 cc/m2/day) and water (10-6 g/m2/day);

The width of the hermetic seal should be small (e.g., <2 mm) so that it does not have an adverse effect on the size of the OLED display;

The temperature generated during a sealing process should not damage the materials (e.g., electrodes and organic layers) within the OLED display. For instance, in a typical OLED display, the first pixels of OLEDs are located close to the hermetic seal and should not be heated to more than about 85-100° C. during the sealing process;

Any gases released during the sealing process should not contaminate the materials within the OLED display; and The hermetic seal should enable electrical connections (e.g., thin-film electrodes) to enter the OLED display.

Today the most common way for sealing the OLED display is to use different types of epoxies, inorganic materials and/or organic materials that form the seal after they are cured by ultra-violet light. Vitex Systems manufactures and sells a coating under the brand name of Barix™ which is a composite based approach where alternate layers of inorganic materials and organic materials can be used to seal the OLED display. Although these types of seals usually provide good mechanical strength, they can be very expensive and there are many instances in which they have failed to prevent the diffusion of oxygen and moisture into the OLED display.

Another common way for sealing the OLED display is to utilize metal welding or soldering. However, the resulting seal is not durable in a wide range of temperatures because of the substantial differences between the coefficients of thermal expansions (CTEs) of the glass plates and metal in the OLED display.

The aforementioned problems and other shortcomings associated with traditional seals have been addressed in co-assigned U.S. Pat. No. 6,998,776 and published U.S. patent application No. 2005/001,545 (hereinafter the '776 patent and the '545 application) which are incorporated herein by reference. Briefly, the '776 patent and '545 application disclose that a hermetically sealed OLED display is manufactured by providing a first substrate plate and a second substrate plate, and depositing a frit onto the second substrate plate. OLEDs are deposited onto the first substrate plate. An irradiation source (e.g., laser, or infrared light) is then used to heat the frit, which forms a hermetic seal that connects the first substrate plate to the second substrate plate and also protects the OLEDs. The frit can be glass that is doped with at least one absorbing species, such as a transition metal, and optionally a CTE lowering filler, such that when the irradiation source heats the frit, it softens and forms a bond with the substrate plates, creating a hermetic seal. This type of frit can be softened and form the hermetic seal, while avoiding thermal damage to the OLEDs.

The frits disclosed in the '776 patent and '545 application, when pre-sintered as disclosed therein, form better seals if the pre-sintered frit is ground to reduce thickness variations. The need for grinding increases the cost and complexity of the OLED manufacturing process. Accordingly, it is desirable to obtain a chemically and mechanically stable, long lasting hermetic seal from pre-sintered frit without the need for a grinding step. Eliminating the grinding step reduces the cost and complexity of the OLED production process. This need and other needs are satisfied by the hermetic sealing technology of the present invention.

BRIEF SUMMARY OF THE INVENTION

The present invention includes a hermetically sealed OLED display, and display preform, and method for manufacturing the hermetically sealed OLED display and display preform. Basically, the hermetically sealed OLED display is manufactured by providing a first substrate plate and a second substrate plate, depositing a frit onto the second substrate plate and pre-sintering the deposited frit. Any need to grind the sintered frit to reduce thickness variations is avoided by 1) using a frit comprising a base glass selected from $Fe_2O_3$ or rare earth metal oxide doped $Sb_2O_3$—$V_2O_5$—$P_2O_5$ glasses of a controlled particle size distribution and, optionally, a CTE matching filler of a controlled particle size distribution, and 2) pre-sintering the deposited frit in an atmosphere which is less oxidizing than air. OLEDs are deposited onto the first substrate plate. An irradiation source (e.g., laser or infrared light) is then used to heat the frit which softens and forms a hermetic seal that bonds the first substrate plate to the second substrate plate and also protects the OLEDs. This enables the frit to soften and form the hermetic seal while avoiding thermal damage to the OLEDs.

DETAILED DESCRIPTION OF THE INVENTION

The present invention provides an improved method for manufacturing a hermetically sealed OLED display and display preform. Although the sealing process of the present invention is described below with respect to the fabrication of a hermetically sealed OLED display 100, it should be understood that the same or similar sealing process can be used in other applications where two glass plates need to be sealed to one another. Accordingly, the present invention should not be construed in a limited manner.

Figure 1:
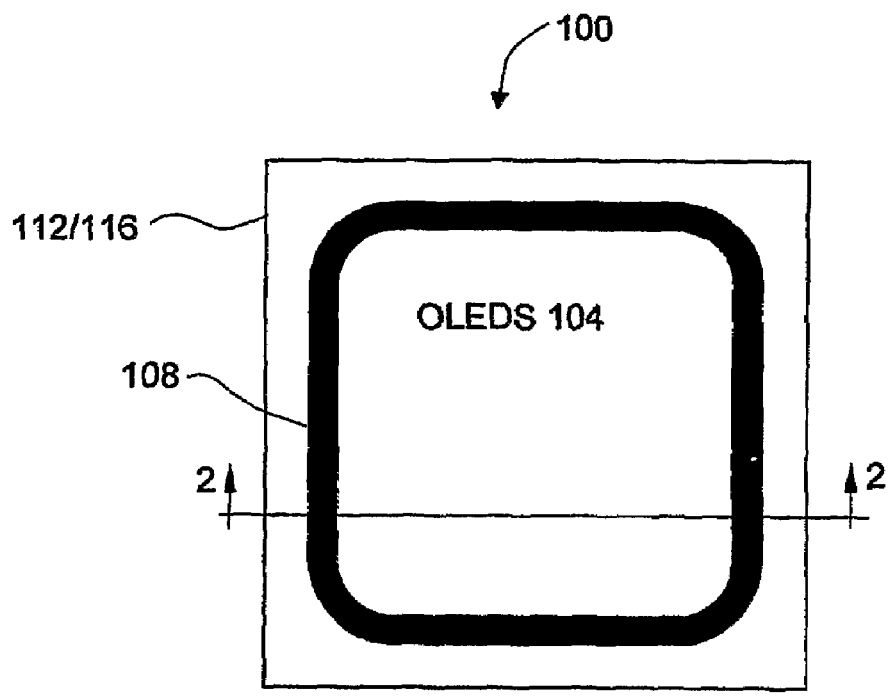
FIGS. 1 and 2 are a top view and a cross-sectional side view illustrating the basic components of a hermetically sealed OLED display in accordance with the present invention.
Figure 2:
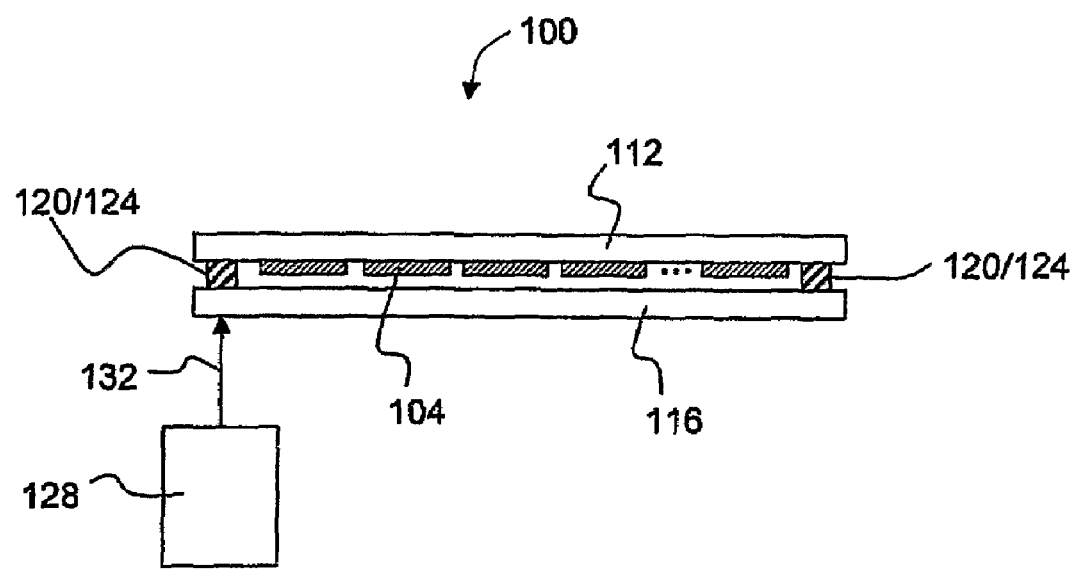

Referring to FIGS. 1 and 2 there are a top view and a cross-sectional side view illustrating the basic components of the hermetically sealed OLED display 100. The OLED display 100 includes a multilayer sandwich of a first substrate plate 102 (e.g., glass plate 102), an array of OLEDs 104, a doped frit 106 (see, e.g., TABLE 1) and a second substrate plate 107. The OLED display 100 has a hermetic seal 108 formed from the frit 106 which protects the OLEDs 104 located between the first substrate plate 102 and the second substrate plate 107 (e.g., glass plate 107). The hermetic seal 108 is typically located around the perimeter of the OLED display 100, and the OLEDs 104 are located within a perimeter of the hermetic seal 108.

How the hermetic seal 108 is formed from the frit 106 and the ancillary components such as the irradiation source 110 (e.g., laser 110a and infrared lamp 110b) which are used to form the hermetic seal 108 are described in greater detail in, e.g., the '776 patent, and, in order not to obscure the current invention, will only be further described herein to the extent necessary to explain the present invention.

$Sb_2O_3$—$V_2O_5$—$P_2O_5$ (SVP) frits are known to be useful for sealing OLED displays. These frits have the notable advantage that they can be quickly sealed by infrared laser energy to produce a strong, hermetic seal that can easily withstand 1000 hours in an 85° C., 85% relative humidity environment (hereinafter referred to as "85/85 environment"), without loss of hermeticity. Manufacturing considerations make it desirable to pre-sinter the frit onto one of the glass substrates prior to sealing the OLED display with a laser. In an OLED display application, a pre-sintered frit will make a better laser seal if it has a flat, even surface of about 12-15 μm in height. One method of creating such a flat even surface is to grind pre-sintered frit to those specifications. Grinding has disadvantages, however, including the time, equipment and process steps required to grind the frit.

The present invention discloses SVP based frits, and optionally a filler such as a coefficient of thermal expansion (CTE) filler, which are pre-sintered to form flat even surfaces of about 12-15 μm in height and which do not require grinding to achieve the flat even surfaces. These advantages are achieved through a combination of process steps and composition changes.

One aspect of the present invention is to control the particle size distribution of both the base glass and the filler. For example, if the particles are not carefully selected, some of the particles can be larger, up to about 44 μm in diameter, than the desired 12-15 μm height of the frit deposited on the glass substrate. Even following pre-sintering, these large particles would extend up above the rest of the frit, creating a surface which is not smooth and not of the requisite height, resulting in the need for grinding.

A second aspect of the present invention is to pre-sinter the frit at a lower temperature than is typically used to sinter frits in hermetic package sealing applications.

A third aspect of the present invention is to pre-sinter the frit under an atmosphere which is less oxidizing than air, inert or even reducing.

A fourth aspect of the present invention is to modify the composition of the frit to include $Fe_2O_3$ or a rare earth metal oxide.

Particle Size Distribution

We have found that to achieve a flat even frit surface without the need for grinding, it is advantageous to select base glass particles and filler particles of appropriate particle size distributions. For example, forming the frit from about 65-100 wt. % SVP base glass and 0-35 wt. % β-eucryptite filler, where the base glass particles have a mean particle size distribution of less than 3 μm, and the filler particles have a mean particle size distribution of between about 3 and about 7 μm, will result in a flat even frit, between 12-15 μm in height, following sintering.

The base glass particles and filler particles of the appropriate mean particle size distribution can be obtained by ball-milling, or any other suitable milling or grinding method, to obtain a mean particle size distribution of 7 μm followed by air-classification to obtain the respective desired particle size distributions. Although not wishing to be bound by any particular theory of operation, it is believed that limiting the base glass and filler to the small particle sizes and described particle size distributions enables the particles to pack together to form a uniform frit height once deposited on the substrate glass and sintered as described below. The frit can optionally be mixed with suitable organic binders to allow it to be deposited uniformly onto the glass substrate and to stay formed until it is pre-sintered. It should be noted that when frit composition is discussed herein in terms of wt. %, the percentages are exclusive of any binder which is used. Binder is added "on top" of the 100 wt % of the frit and burns off when the binder containing frit is heated in an oxidizing atmosphere.

Pre-sintering Temperature

Once the frit has been deposited on the substrate glass, and prior to final laser sealing, the frit is pre-sintered. Pre-sintering of frits not of the present invention is typically performed at about 450° C. We have found that the frits of the present invention should be sintered at temperatures between about 390° C. and about 415° C., or about 400° C. for about two hours.

The lower pre-sintering temperature is selected because the finer frit of the present invention does not flow sufficiently during subsequent laser sealing to form a good seal to the OLED substrate glass after 450° C. pre-sintering. We have discovered that lower temperature pre-sintering results in a frit which does exhibit acceptable flow during laser sealing to form a good bond.

Pre-sintering Atmosphere

While the lower temperature pre-sintered frit exhibits acceptable flow and forms a good bond to the substrate glass during laser sealing, tests have shown that the finer frit, sintered at 400° C. in air exhibits less durable seals than those obtained using the larger frit particle size distributions which are pre-sintered at 450° C.

We have found that if the frits of the present invention are pre-sintered at the lower temperatures of the present invention in an atmosphere which is less oxidizing than air, the durability (resistance to chemical attack) of the resulting seals is improved.

So, for example, the pre-sintering atmosphere may contain from no more than about 10% $O_2$, to about no more than 5%

$O_2$, or to no more than about 1% $O_2$. The balance of the atmosphere can be any inert or reducing gas, such as, for example, $N_2$. A 100% inert atmosphere may also be used.

If, as is common in the art, an organic binder is used to hold the frit together and make it easier to dispense onto the substrate, then the dispensed frit can be heated to about 300° C. to about 350° C., or about 325° C., for about an hour to burn off the binder, and then pre-sintered in a less oxidizing atmosphere as described above.

Frit Base Glass Composition

While low-temperature pre-sintering of fine frits under a less oxidizing atmosphere, as described above, provided hermetic package pre-forms which, upon laser sealing, provided good hermetic seals, further improvements in resistance to chemical attack were found to result through modification of the base glass composition. We have found that the addition of small amounts (less than about 10 mole %) of either $Fe_2O_3$, $Nd_2O_3$ or other rare earth metal oxides, e.g., $La_2O_3$, $Ce_2O_4$, $Pr_6O_{11}$, $Er_2O_3$, or $CeO_2$ were found to lead to improvements in frit durability. Thus, for example, one can add from about 1-10 mole % $Fe_2O_3$, $Nd_2O_3$ or other rare earth metal oxides, or from about 1-5 mole % $Fe_2O_3$, $Nd_2O_3$ or other rare earth metal oxides, or about 2.5 mole % $Fe_2O_3$, $Nd_2O_3$ or other rare earth oxides.

Fine frit compositions of the present invention, when pre-sintered at the lower temperatures and less oxidizing atmospheres of the present invention, exhibited commercially acceptable resistance to chemical attack of greater than 1000 hours in an 85/85 environment.

Tables 1 and 2 describe modified SVP frit base glass compositions which are useful in the present invention.

TABLE 1

$Fe_2O_3$ - SVP Frit Base Glass Compositions
SVP Frit Base Glass Compositions

| Oxide | Mole % (all ranges about) |
| --- | --- |
| $K_2O$ | 0-5 |
| $Fe_2O_3$ | 1-10 |
| $Sb_2O_3$ | 0-35 |
| ZnO | 0-20 |
| $P_2O_5$ | 10-40 |
| $V_2O_5$ | 10-60 |
| $TiO_2$ | 0-5 |
| $B_2O_3$ | 0-5 |
| $SiO_2$ | 0-5 |
| $WO_3$ | 0-5 |

TABLE 2

$Nd_2O_3$ - SVP Frit Base Glass Compositions
SVP Frit Base Glass Compositions

| Oxide | Mole % (all ranges about) |
| --- | --- |
| $K_2O$ | 0-5 |
| $Nd_2O_3$ | 1-10 |
| $Sb_2O_3$ | 0-35 |
| ZnO | 0-20 |
| $P_2O_5$ | 10-40 |
| $V_2O_5$ | 10-60 |
| $TiO_2$ | 0-5 |
| $B_2O_3$ | 0-5 |
| $SiO_2$ | 0-5 |
| $WO_3$ | 0-5 |

The present invention is further illustrated through the following examples.

EXAMPLE 1

Flow-buttons were prepared from base glass composition (mole %): $Sb_2O_3$, 23.5; $V_2O_5$, 47.5; $P_2O_5$, 27.0; $Al_2O_3$, 1.0; $TiO_2$, 1.0 and filler composition (mole %): $Li_2O$, 25.0; $Al_2O_3$, 25.0; $SiO_2$, 50.0, and then pre-sintered in air, one at 400° C. and the other at 450° C. The 400° C. pre-sintered flow button was brown in color, while the 450° C. pre-sintered flow button was black. The flow buttons were then immersed in equal amounts of 90° C. D.I. (de-ionized) $H_2O$ for 48 hours. There was a substantial difference in aqueous durability between the two pre-sintering treatments: the 400° C. flow button exhibited sufficient chemical attack to turn the water a dark black coloration, and the 450° C. pre-sintered flow button exhibiting only minor chemical attack, turning the water a light green. The extent of water discoloration is related to the extent of vanadium leaching from the flow button and the resistance to $H_2O$ chemical attack.

EXAMPLE 2

Controlled Atmosphere Pre-sintering

The major observable change associated with the lowering of pre-sintering temperature from 450° C. to 400° has to do with the color of the frit. For pre-sintering in air, frits heated to 450° C. were black, suggesting reduced vanadium species ($V^{+3}$ or $V^{+4}$) in the frit. Frits pre-sintered at 400° C. in air were invariably brown, suggesting $V^{+5}$ as the dominant oxidation state. Direct confirmation of the color-oxidation state relationship for these frits could, unfortunately, not be obtained with certainty, since the available analytical techniques such as NMR, EPR, or XPS were either unable to detect all three oxidation states, or else gave irreproducible results on seemingly identical samples. However, indirect support for the color-oxidation state relationship exists since samples pre-sintered at 400° C. in increasingly oxidizing atmospheres ranging from 100% $N_2$, 80% $N_2$/20% $O_2$, 50% $N_2$/50% $O_2$, 20% $N_2$/80% $O_2$, and 100% $O_2$ turned increasingly brown, and ultimately appeared yellow. Associated with this color change from black to yellow was a loss in aqueous durability.

EXAMPLE 3

This example demonstrates that pre-sintering under a less oxidizing atmosphere than air increases the environmental durability of the small particle size frits of the present invention. Two different sheets, each containing nine cells, or glass packages, made with SVP frits which did not contain $Fe_2O_3$, $Nd_2O_3$ or other rare earth metal oxides were sealed using a laser and then placed into an 85/85 environment. Prior to sealing, each sheet was initially fired to 325° C. in air to burn off all frit binder volatiles. Following this step, one sheet was pre-sintered to 400° C. in air, while the other sheet was pre-sintered to 400° C. in 100% $N_2$. Oxygen measurements of the furnace atmosphere during the 100% $N_2$ run indicated an $O_2$ level of approximately 20 ppm. After pre-sintering and subsequent laser sealing, the sheets were placed in an 85/85 environmental chamber. Each sheet was then examined about every 48 hours to assess when leaching was initiated on any of the cells. The $N_2$ pre-sintered samples required 624 hours before leaching was observed, while the air pre-sintered samples required only 456 hours before leaching was observed. Note the much longer time required, 624 vs. 456 hrs, needed before observable leaching was noted for the $N_2$ pre-sintered samples.

EXAMPLE 4

This example demonstrates that the addition of rare earth metal or iron oxides to an SVP base glass increases its resistance to chemical attack. As noted above, the frit is basically an $Sb_2O_3$—$V_2O_5$—$P_2O_5$ glass, with the dominant glass-forming species (at nearly 50 mole %) being $V_2O_5$. Glass melts were prepared with additions of 2.5 mole % of either $Nd_2O_3$ or $Fe_2O_3$ added "on top", i.e., 100 mole % SVP base glass plus 2.5 mole % $Nd_2O_3$ or $Fe_2O_3$. Both of these added oxides have the additional benefit of promoting absorbance in the near-IR, which is attractive because sealing can advantageously be carried out with an 810 nm laser. Different levels other than 2.5 mole % were also examined. In the case of $Nd_2O_3$, melts were made ranging from 1.0 to 5.0% addition. However, the solubility limit in the SVP base glass appeared to be between about 2.5-5.0 mole %, so much higher levels than 2.5% were not desirable. In the case of $Fe_2O_3$, melts were made ranging from 1.0 to 10.0 mole %. The solubility limit for $Fe_2O_3$ in the SVP base glass appeared to be between about 5.0 and 10.0 mole %. Thus $Fe_2O_3$ can be added to the SVP base glass in amounts of between about 1 and about 5% or between about 1 and about 10%.

Figure 3:
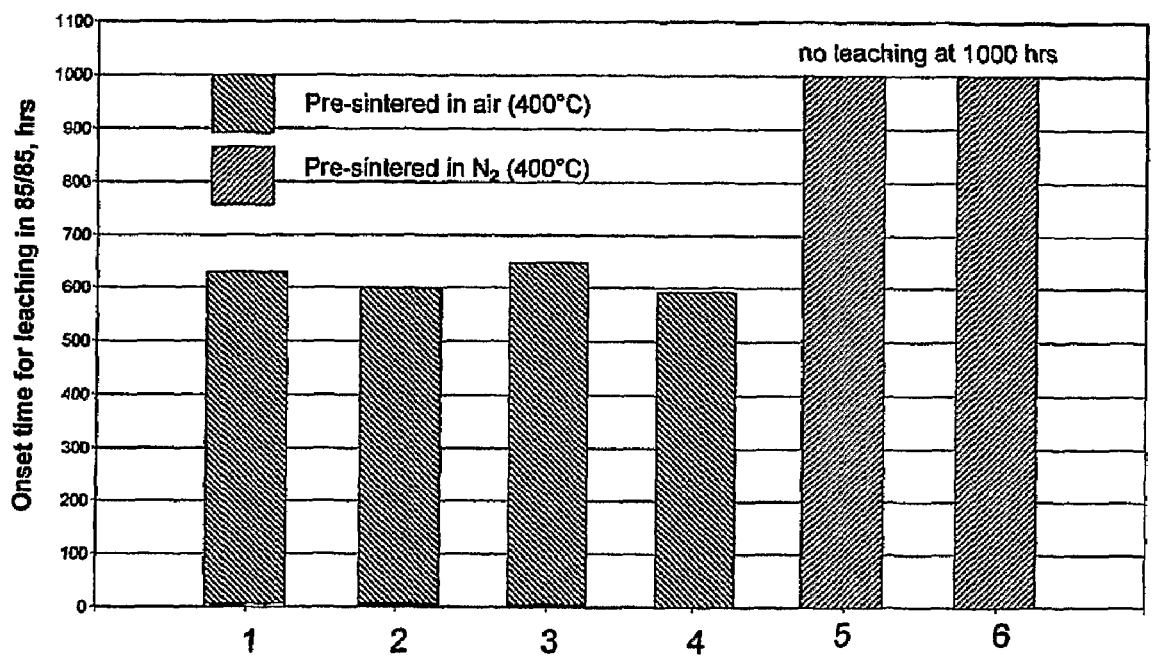
FIG. 3 is a chart comparing the hermetic performance of glass packages made according to the present invention with glass packages which do not include all of the elements of the invention.

The base glasses are shown in Table 3, along with immersion durability results for flow buttons of 70:30 base glass: filler fired under various conditions. The finer no-grind particle sizing, i.e., base glass having a mean particle size distribution of less than 3 μm, and filler having a mean particle size distribution of between about 3 and about 7 μm, was used for all blends. A color of "black" for the water supernatant was considered poor, while a rating of light green or very light green was considered acceptable. Note that both the $Fe_2O_3$ and $Nd_2O_3$-modified base glasses resulted in blends which were superior from a durability performance compared to the corresponding blend made with the unmodified base glass.

oxidizing atmosphere than air. 6×6" sheets, each containing nine cells for the 70:30 blend made with the 2.5% $Fe_2O_3$-modified base glass were prepared. The sheets were pre-sintered, samples 1-4 in air and samples 5 and 6 in 100% $N_2$, and then sealed with a laser. The finer No-grind sizing, i.e., base glass having a mean particle size distribution of less than 3 μm, and filler having a mean particle size distribution of between about 3 and about 7 μm, was used for all samples. The $N_2$ pre-sintered, $Fe_2O_3$ containing frit was superior to this same $N_2$ pre-sintered control frit, with no leaching observed, even after 1000 hours in 85/85. The leaching data for the 6×6" sheets are listed in FIG. 3.

Although specific embodiments of the invention have been discussed, a variety of modifications to those embodiments which do not depart from the scope and spirit of the invention will be evident to persons of ordinary skill in the art from the disclosure herein. The following claims are intended to cover the specific embodiments set forth herein as well as such modifications, variations, and equivalents.

We claim:
1. A method for making a hermetically sealed glass package preform comprising:
  depositing a frit onto a glass substrate wherein the frit comprises about 65-100 wt. % of a base glass and about 0-35 wt. % of a filler;
  wherein the base glass comprises:
    about 0-5 mole % $K_2O$;
    about 0-35 mole % $Sb_2O_3$;
    about 0-20 mole % ZnO;
    about 10-40 mole % $P_2O_5$;
    about 10-60 mole % $V_2O_5$;
    about 0-5 mole % $TiO_2$;
    about 0-5 mole % $B_2O_3$;
    about 0-5 mole % $SiO_2$;
    about 0-5 mole % $WO_3$; and
    about 1-10 mole % of a metal oxide selected from the group consisting of $Fe_2O_3$, $Nd_2O_3$, $La_2O_3$, $Ce_2O_4$, $Pr_6O_{11}$, $Er_2O_3$, and $CeO_2$;

TABLE 3

Durability performance of blends made with $Fe_2O_3$ and $Nd_2O_3$-modified base glasses

| | | "Control" | | $Fe_2O_3$-series 2.5% | | $Nd_2O_3$-series 2.5% | | 5.0% | |
|---|---|---|---|---|---|---|---|---|---|
| Composition of base glass (mole %) | | $Sb_2O_3$ | 23.5 | $Sb_2O_3$ | 22.9 | $Sb_2O_3$ | 22.9 | $Sb_2O_3$ | 22.4 |
| | | $V_2O_5$ | 47.5 | $V_2O_5$ | 46.3 | $V_2O_5$ | 46.3 | $V_2O_5$ | 45.2 |
| | | $P_2O_5$ | 27.0 | $P_2O_5$ | 26.3 | $P_2O_5$ | 26.3 | $P_2O_5$ | 25.7 |
| | | $TiO_2$ | 1.0 | $TiO_2$ | 1.0 | $TiO_2$ | 1.0 | $TiO_2$ | 1.0 |
| | | $Al_2O_3$ | 1.0 | $Al_2O_3$ | 1.0 | $Al_2O_3$ | 1.0 | $Al_2O_3$ | 1.0 |
| | | | | $Fe_2O_3$ | 2.4 | $Nd_2O_3$ | 2.4 | $Nd_2O_3$ | 4.8 |
| 48 hr immersion durability for fired flow button of 70:30 blend (wt basis, base glass:filler) | 450° C. air | light green | | light green | | light green | | (not tested) | |
| | 400° C. $N_2$ | light green | | very light green | | very light green | | (not tested) | |
| | 400° C. air | black | | black | | black | | (not tested) | |

EXAMPLE 5

This example demonstrates that while the $Fe_2O_3$ doped frits of the present invention increase the chemical resistance to attack they also benefit from being pre-sintered in a less wherein the base glass has a mean particle size distribution of less than about 3 μm; and
  wherein the filler has a mean particle size distribution of between about 3 and 7 μm.

2. The method of claim 1 where the base glass comprises about 1-5 mole % of a metal oxide selected from the group consisting of $Fe_2O_3$, $Nd_2O_3$, $La_2O_3$, $Ce_2O_4$, $Pr_6O_{11}$, $Er_2O_3$, and $CeO_2$.

3. The method of claim 1 further comprising the step of pre-sintering the hermetically sealed package preform at a temperature between about 390° C. and about 415° C.

4. The method of claim 3 wherein the pre-sintering is carried out in an atmosphere less oxidizing than air.

5. The method of claim 3 wherein the pre-sintering is carried out in an atmosphere comprising about 10% $O_2$ and about 90% of an inert gas.

6. The method of claim 3 wherein the pre-sintering is carried out in an atmosphere comprising about 5% $O_2$ and about 95% of an inert gas.

7. The method of claim 3 wherein the pre-sintering is carried out in an inert atmosphere.

8. The method of claim 3 wherein the pre-sintering is carried out in a reducing atmosphere.

9. The method of claim 1 wherein the filler is a CTE matching filler.

10. The method of claim 1 wherein the filler is β-eucryptite.

11. A hermetically sealed glass package preform comprising:
   a glass substrate;
   a frit comprising 65-100 wt. % of a base glass and about 0-35 wt. % of a filler;
   wherein the base glass comprises:
      about 0-5 mole % $K_2O$;
      about 0-35 mole % $Sb_2O_3$;
      about 0-20 mole % ZnO;
      about 10-40 mole % $P_2O_5$;
      about 10-60 mole % $V_2O_5$;
      about 0-5 mole % $TiO_2$;
      about 0-5 mole % $B_2O_3$;
      about 0-5 mole % $SiO_2$;
      about 0-5 mole % $WO_3$; and
      about 1-10 mole % of a metal oxide selected from the group consisting of $Fe_2O_3$, $Nd_2O_3$, $La_2O_3$, $Ce_2O_4$, $Pr_6O_{11}$, $Er_2O_3$, and $CeO_2$;
   wherein the base glass has a mean particle size distribution of less than about 3 μm; and
   wherein the filler has a mean particle size distribution of between about 3 and 7 μm.

12. The package of claim 11 where the base glass comprises about 1-5 mole % of a metal oxide selected from the group consisting of $Fe_2O_3$, $Nd_2O_3$, $La_2O_3$, $Ce_2O_4$, $Pr_6O_{11}$, $Er_2O_3$, and $CeO_2$.

13. The package of claim 11 further comprising the step of pre-sintering the hermetically sealed package preform at a temperature between about 390° C. and about 415° C.

14. The package of claim 13 wherein the pre-sintering is carried out in an atmosphere less oxidizing than air.

15. The package of claim 13 wherein the pre-sintering is carried out in an atmosphere comprising about 10% $O_2$ and about 90% of an inert gas.

16. The package of claim 13 wherein the pre-sintering is carried out in an atmosphere comprising about 5% $O_2$ and about 95% of an inert gas.

17. The package of claim 13 wherein the pre-sintering is carried out in an inert atmosphere.

18. The package of claim 13 wherein the pre-sintering is carried out in a reducing atmosphere.

19. The package of claim 11 wherein the filler is a CTE matching filler.

20. The package of claim 11 wherein the filler is β-eucryptite.

* * * * *